(12) United States Patent
Price et al.

(10) Patent No.: US 6,614,675 B1
(45) Date of Patent: Sep. 2, 2003

(54) PIPELINED CONTENT ADDRESSABLE MEMORY WITH READ ONLY ELEMENT ENCODING SCHEME

(75) Inventors: Carol A. Price, Jamison, PA (US); Fangxing Wei, Chandler, AZ (US)

(73) Assignee: ATI International, SRL, Barbados (KN)

( * ) Notice: Subject to any disclaimer, the term of this patent is extended or adjusted under 35 U.S.C. 154(b) by 24 days.

(21) Appl. No.: 09/685,699

(22) Filed: Oct. 10, 2000

(51) Int. Cl.[7] .............................................. G11C 15/00
(52) U.S. Cl. ........................................ 365/49; 711/108
(58) Field of Search .............................. 365/49; 711/108

(56) References Cited

U.S. PATENT DOCUMENTS

| 6,069,573 | A | * | 5/2000 | Clark, II et al. ............... 341/50 |
| 6,105,110 | A | * | 8/2000 | Watkins ....................... 711/135 |
| 6,249,449 | B1 | * | 6/2001 | Yoneda et al. ................ 365/49 |
| 6,268,807 | B1 | * | 7/2001 | Miller et al. .................. 341/50 |
| 6,301,636 | B1 | * | 10/2001 | Schultz et al. .............. 711/108 |

* cited by examiner

Primary Examiner—David Nelms
Assistant Examiner—Connie C. Yoha
(74) Attorney, Agent, or Firm—Volpe and Koenig, P.C.

(57) ABSTRACT

A content addressable memory (CAM) has a CAM array and a CAM encoder. The CAM array in response to data stored in a memory address of the CAM array matching comparison data, produces a match signal corresponding to the memory address. The CAM encoder receives the match signal and using encoded cells, produces the memory address corresponding to the match signal.

16 Claims, 4 Drawing Sheets

| ENCODER MATRIX 36 | | | | | | | | | 40 ENCODER ROW NUMBER |
|---|---|---|---|---|---|---|---|---|---|
| | | | CELL ELEMENTS 38 | | | | | | |
| 0 | 0 | 0 | 0 | 0 | 0 | 0 | 0 | 0 | 0 |
| 0 | 0 | 0 | 0 | 0 | 0 | 0 | 0 | 1 | 1 |
| 0 | 0 | 0 | 0 | 0 | 0 | 0 | 1 | 0 | 2 |
| 0 | 0 | 0 | 0 | 0 | 0 | 0 | 1 | 1 | 3 |
| 0 | 0 | 0 | 0 | 0 | 0 | 1 | 0 | 0 | 4 |
| 0 | 0 | 0 | 0 | 0 | 0 | 1 | 0 | 1 | 5 |
| 0 | 0 | 0 | 0 | 0 | 0 | 1 | 1 | 0 | 6 |
| 0 | 0 | 0 | 0 | 0 | 0 | 1 | 1 | 1 | 7 |
| 0 | 0 | 0 | 0 | 0 | 1 | 0 | 0 | 0 | 8 |
| ... | | | | | | | | | |
| 1 | 1 | 1 | 1 | 1 | 1 | 1 | 0 | 0 | 508 |
| 1 | 1 | 1 | 1 | 1 | 1 | 1 | 0 | 1 | 509 |
| 1 | 1 | 1 | 1 | 1 | 1 | 1 | 1 | 0 | 510 |
| 1 | 1 | 1 | 1 | 1 | 1 | 1 | 1 | 1 | 511 |

*FIG. 3*

PIPELINED CONTENT ADDRESSABLE
MEMORY WITH READ ONLY ELEMENT
ENCODING SCHEME

BACKGROUND

The invention generally relates to electrical memory systems. In particular, the invention relates to content addressable memories.

FIG. 1 is an illustration of a content addressable memory (CAM) 10. CAM 10 has certain advantages over other types of memory, such as random access memory. Typically, other types of memory write and read data from specified memory addresses. To read data in such a system, a memory address associated with the desired data is provided and the data from that address is returned to the system.

CAM 10 determines the address associated with certain data. For example, the data having the content of "00010110" is stored in row address 03H (Hex) during a write operation. During a compare operation, when provided with the comparison data of "00010110", the CAM 10 determines that address 03H (Hex) contains that data. Instead of outputting the data to the system, the CAM 10 outputs the address having that data content. CAMs 10 have high applicability in look-up table applications.

One CAM 10 is shown in FIG. 1. The address decoder 12 provides a row access to the content data stored in the CAM array 14. The content data location is defined by the inputs on the address line during a read operation. The content data in the CAM array 14 is sent onto the output read lines such as via the read and write circuits. The address decoder 12 also provides a row access for data to be written into a memory address for CAM array 14. To write information into the CAM array 14, the desired data from the incoming write data lines is stored into various locations of the CAM 10 based on the incoming address line information.

To perform a search of specific data within the CAM 10, the compare data lines sends the desired comparison data to the CAM array 14. If the previous data stored in any CAM location matches the incoming comparison data, a match signal is activated. A CAM encoder 16 is used to determine the address location associated with the match signal. The output circuitry 18 is used to drive out the matched row address that corresponds to the matching data location.

Additionally, some CAMs have prioritization circuitry. The prioritization circuitry is used to determine which address, based on a defined priority scheme, should be outputted if multiple match line signals are activated.

Some CAM encoders 16 use a read only memory (ROM) array. The ROM array may be programmed via mask levels prior to fabrication for use in determining the addresses associated with the match signals. A drawback to using a programmable ROM array is the extensive time and cost of developing the ROM arrays which makes them only cost effective in mass production.

Another type of CAM encoder 16, using NOR gates and combinational logic, may be implemented to encode the address information if the match signal is present. A drawback to combinational logic is that it is typically slow especially for larger CAM sizes. An alternate approach uses priority encoding schemes in tandem with combinational logic. Although these systems are typically faster than straight combinational logic, these schemes may increase the cost of the system through increased layout area, and longer testing methods.

Accordingly, it is desirable to have alternate CAM design schemes.

SUMMARY

A content addressable memory (CAM) has a CAM array and a CAM encoder. The CAM array in response to data stored in a memory address of the CAM array matching comparison data, produces a match signal corresponding to the memory address. The CAM encoder receives the match signal and using encoded cells, produces the memory address corresponding to the match signal.

BRIEF DESCRIPTION OF THE DRAWINGS

FIG. 3 is an encoder matrix.

DESCRIPTION OF THE PREFERRED EMBODIMENT(S)

Figure 1:
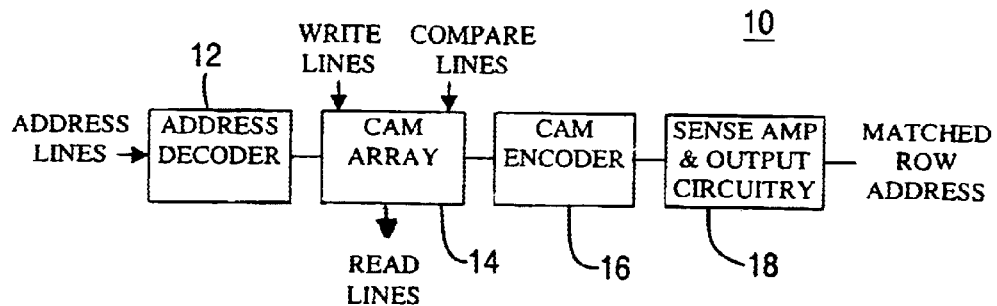
FIG. 1 is a CAM.
Figure 2:
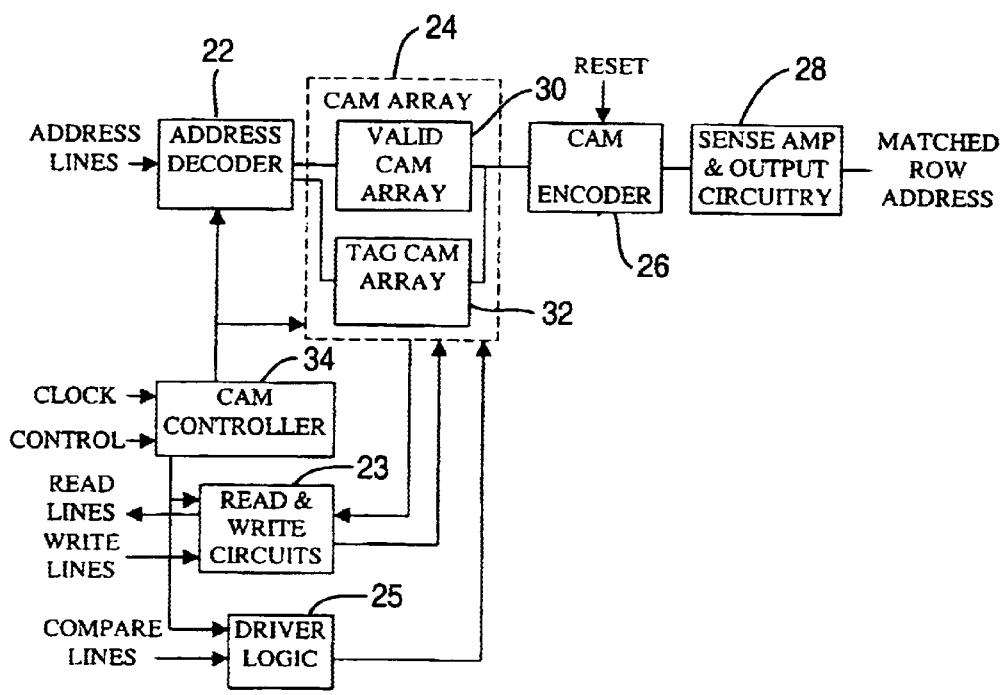
FIG. 2 is a CAM having a read only element encoding scheme.

FIG. 2 is a CAM 20 having a read only storage element encoding scheme. An address decoder 22 provides the row access as defined by the incoming data on the address lines to the CAM array 24. The read and write circuits 23, in conjunction with the inputs of the read lines, write lines, and the control signals coming from the CAM controller 34, provide read and write operations to the CAM array 24. The CAM array 24 stores the data from the write lines at locations defined by the address lines. Conversely, when reading from the CAM array 24, the content data will be outputted onto the read lines based on the location specified by the address lines.

The driver logic 25 serves to drive the data from the incoming compare data lines to the CAM array 24 based on the signal requests from the CAM controller 34. The compare data lines provide the data content for comparison with the previously stored data in the CAM array 24. If the incoming comparison data is equivalent to the content data in the CAM array 24, the CAM array 24 will activate a match signal. CAM array 24 is configured with a valid CAM array 30 and a tag CAM array 32 as shown in FIG. 2, although various configurations of CAM architectures may be used. The tag CAM array 32 stores the content data. Data is written to the tag CAM array 32. The valid CAM array 30 is used to hold the status bit information of the content data stored in the tag CAM 32. The valid bit determines whether the desired tag CAM location contains valid data, or whether the location is available for writing.

A CAM encoder 26 receives the match signals from the CAM array 24. The encoder 26 uses an encoded matrix of read only storage elements to determine the address of the activated match signal. The encoder matrix 36 for a CAM array 24 having 512 rows is shown in FIG. 3. Each row in cell elements 38 contains a combination of read only storage elements that correspond to the binary address of all CAM locations. When the CAM array 24 activates a match signal for a particular row, the information stored in the encoder can be used to define the row address of the matched data location.

Figure 4:
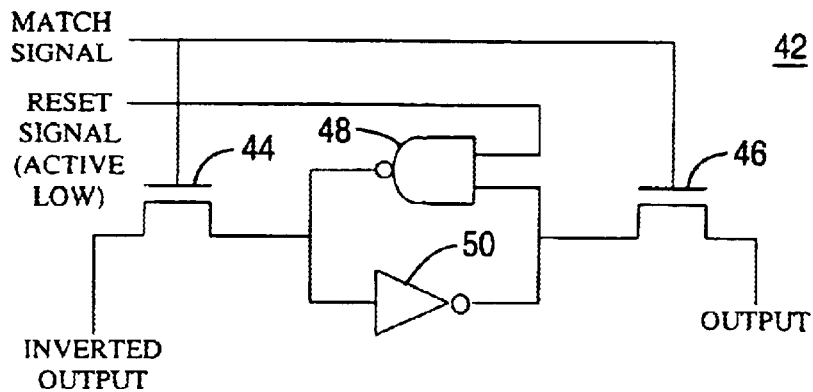
FIG. 4 is a read only storage element representing a zero.
Figure 5:
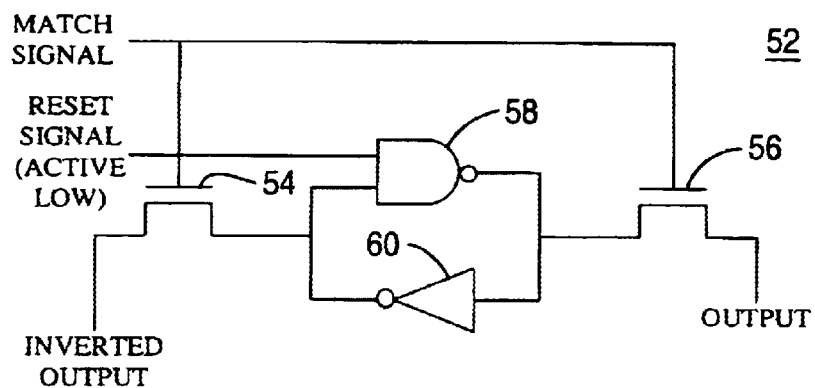
FIG. 5 is a read only storage element representing a one.

The reset input signal, such as an active low reset input signal, of the cells 42, 52 of FIGS. 4 and 5 allows for a fast set up time for the cell elements 38. The reset signal allows the cells 42, 52 to be preset or programmed during system initialization, and are ready for use on the first clock cycle.

The use of the read only storage elements defined in the encoder matrix 36 simplifies the initial setting of the CAM encoder 26 by use of the reset signal during system initialization. The encoder matrix 36 is also adaptable and scalable to a variety of CAM applications, as well as any application requiring a binary matrix of preset values.

To encode the matrix 36, read only storage cells such as in FIGS. 4 and 5, may be used. FIG. 4 is a cell 42 representing a "0" element in the cell elements 38 in FIG. 3. The cell 42 receives the match signal for the corresponding matched row. If the match signal is a one, the gates of the two transistors 44, 46 are opened driving the output to a zero and the inverted output to a one. Conversely, if the match signal is a zero, the gates are closed and the two outputs remain at the previous precharged state, such as at VDD/2. As a result, when the match signal is a one, the cell 42 outputs its desired value, "0". The inverter 50 assures that the output and the inverted output are inverted with respect to each other. The NAND gate 48 is used to reset the cell 42 as required by the system based on the active low reset signal.

FIG. 5 is a cell 52 representing a "1" element. The cell 52 receives the match signal. If the match signal is a one, the gates of the two transistors 54, 56 are opened driving the output to a one and the inverted output to a zero. Conversely, if the match signal is a zero, the gates are closed and the two outputs remain at the previous precharged state, such as VDD/2. As a result, when the match signal is a one, the cell 52 outputs its desired value, "1". The NAND gate 58 and inverter 60 are used for resetting the cell 52 and maintaining an inversion between the two outputs. Using the cells 42, 52 of FIGS. 4 and 5, an entire matrix 38 of read only storage elements, such as in FIG. 3, is developed.

Figure 6:
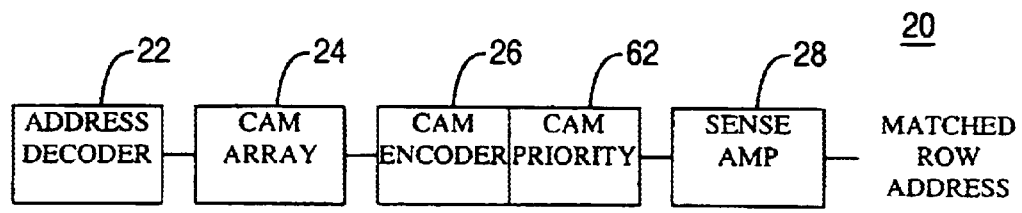
FIG. 6 is a CAM using prioritization.

Typically, if prioritization circuitry is used in the CAM 20, it may be located as shown in FIG. 6. The match signals are input into the CAM encoder 26. If multiple match signals are activated, the prioritization circuitry 62 determines which of the match signals has higher priority, and only allows that signal to pass to the CAM sense amp 28.

Figure 7:
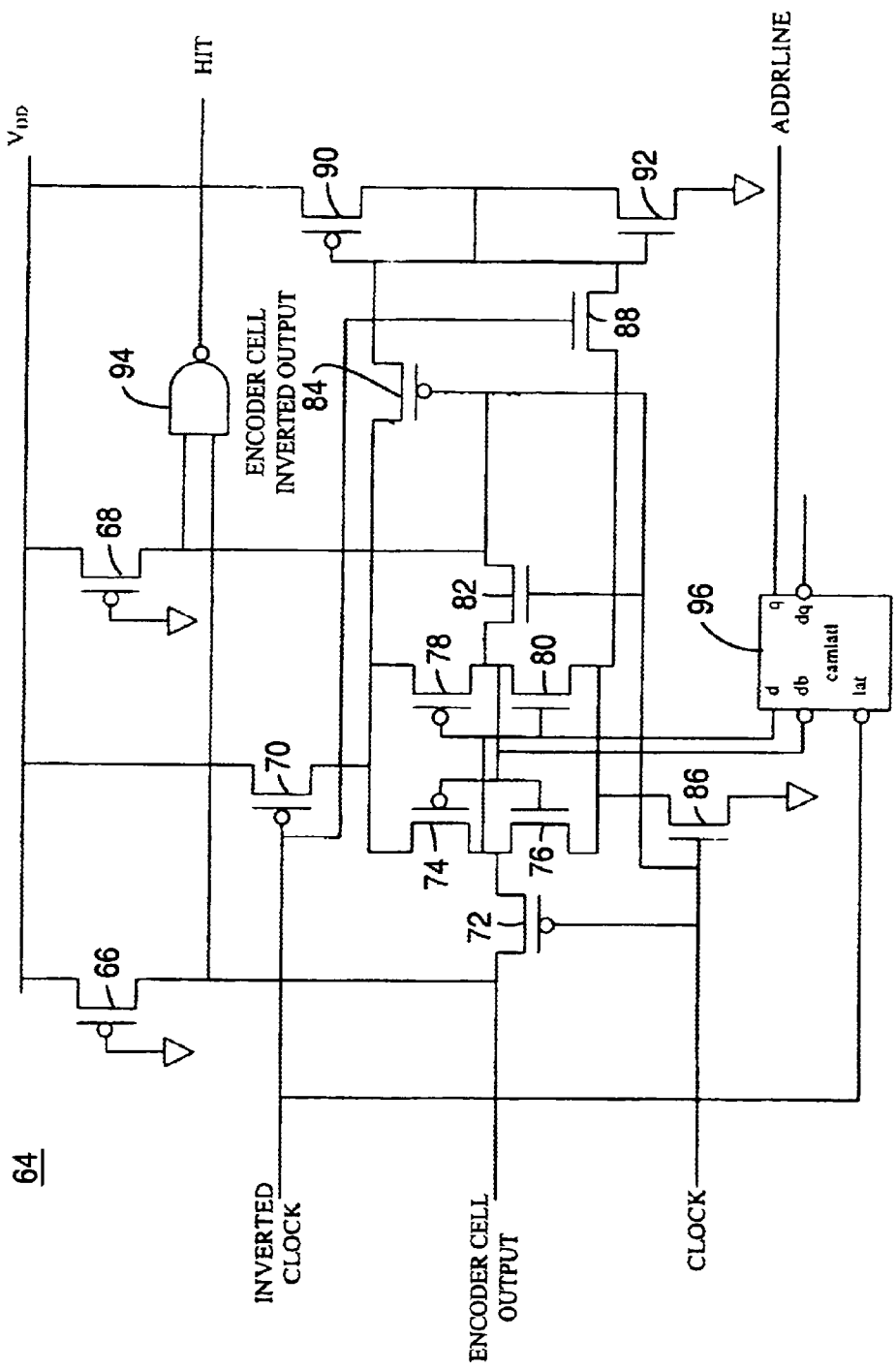
FIG. 7 is a sense amp circuit.

A differential sense amp 28 senses the two logic levels of the outputs from the encoder read only storage elements. A sensing cell 64 for use in a sense amp 28 is shown in FIG. 7. The sensing cell 64 receives a corresponding matrix cell's output and inverted output. A clock and an inverted clock signal are used to clock the sensing cell 64. Due to the configuration of the transistors 66–92, NAND gate 94, and a clocked latch 96, when the output from the corresponding matrix cell is activated by the match signal, both a hit signal and an addrline signal are produced. The hit signal indicates that there was a hit between the content data and the comparison data somewhere within the CAM array 24. The addrline signal indicates that this particular row contains the address of the data matching location. In certain applications, the hit signal and the addrline signal outputs may be extended and/or coupled for other CAM functions. To extend each output's range, appropriate combinational logic may be used. The clocked latch 96 may be used as a method of pipelining the output data. Other clocked latches may be used throughout the CAM design to assure a synchronization of the pipelining data from the incoming clock frequency, and the incoming operational codes that may request a read, write, or compare operation.

To illustrate using the cells 42, 52 of FIGS. 4 and 5 and the encoder matrix 36 of FIG. 3, the CAM 20 is searching for a match for data content "00010110". In the CAM array 24, matching content is found at address location 02H (Hex). After receiving the activated match signal, the row of cells in the CAM encoder matrix 36 corresponding to address 02H are driven to their assigned value, "000000010". The corresponding cells 64 in the sense amp 28 detect this change in state in the CAM encoder cells and output corresponding hit and addrline signals. The outputs of the CAM encoder cells 42, 52 corresponding to these sense amp cells 64 are sent by the sense amp 28 as the matching address, "000000010", and are outputted to the system as the matched row address.

A CAM controller 34 is used to control the operations of the CAM components, such as the address decoder 22, CAM array 24, CAM encoder 26, sense amp and output circuitry 28, read and write circuits 23, and driver logic 25. The CAM controller 34 is operatively coupled to the CAM components. The CAM functionality is directly timed by the input clock frequency. The use of pipelining techniques, such as clocked latches for specific signals, are used throughout the CAM design to assure the sequential output of data based on the clock frequency.

The configuration of the CAM 20 having a read only element encoding scheme facilitates pipelining. The CAM encoder matrix array 36 quickly identifies the address of the CAM array match signal for detection by the sense amp and output circuitry 28. This facilitates the CAM operating in environments of 300 megahertz or above.

What is claimed is:

1. A content addressable memory (CAM) comprising:
   a CAM array having an input configured to receive comparison data, the CAM array in response to data stored in a memory address of the CAM array matching the comparison data, producing a match signal corresponding to that memory address;
   a single CAM encoder having an input configured to receive the match signal and using encoded cells to produce the memory address corresponding to the match signal; and
   wherein the encoded cells are binary read only storage elements and are capable of producing the memory address on a first clock cycle after being reset.

2. A content addressable memory (CAM) comprising:
   a CAM array having an input configured to receive comparison data, the CAM array in response to data stored in a memory address of the CAM array matching the comparison data, producing a match signal corresponding to that memory address;
   a single CAM encoder having an input configured to receive the match signal and using encoded cells, to produce the memory address corresponding to the match signal;
   wherein the encoded cells are binary read only storage elements representing either a "0" or a "1" value in a binary representation of a memory address of the CAM;
   wherein each encoded cell includes a transistor for outputting that cell's represented value in response to a match signal input into that cell, each transistor having an input receiving the match signal input; and
   wherein each cell has a NAND gate and an inverter for use in producing an inverted output.

3. The CAM of claim 2 wherein each cell's NAND gate has an input for receiving a reset signal for resetting the cell.

4. The CAM of claim 2 wherein each cell has an inverted output transistor for outputting that cell's inverted output.

5. A content addressable memory (CAM) comprising:
a CAM array having an input configured to receive comparison data, the CAM array in response to data stored in a memory address of the CAM array matching the comparison data, producing a match signal corresponding to that memory address;
a single CAM encoder having an input configured to receive the match signal and using encoded cells to produce the memory address corresponding to the match signal; and
a differential sense amp for sensing a change in state of the CAM encoder encoded cells, the sense amp having sense cells, each sense cell uniquely associated with one of the CAM encoder encoded cells.

6. The CAM of claim 5 wherein each sense cell outputs a hit signal if its associated encoded cell produced a portion of a memory address.

7. A content addressable memory (CAM) comprising:
a CAM array having an input configured to receive comparison data, the CAM array in response to data stored in a memory address of the CAM array matching the comparison data, producing a match signal corresponding to that memory address;
a single CAM encoder having an input configured to receive the match signal and using encoded cells to produce the memory address corresponding to the match signal;
wherein each encoded cell includes a transistor for outputting that cell's represented value in response to a match signal input into that cell, each transistor having an input receiving the match signal input; and
wherein each cell has a NAND gate and an inverter for use in producing an inverted output.

8. A content addressable memory (CAM) comprising:
a CAM array having an input configured to receive comparison data, the CAM array in response to data stored in a memory address of the CAM array matching the comparison data, producing a match signal corresponding to that memory address;
a single CAM encoder having an input configured to receive the match signal and using encoded cells to produce the memory address corresponding to the match signal; and
wherein the encoded cells are capable of producing the memory address on a first clock cycle after being reset.

9. The CAM of claim 8 wherein said match signal is unique for each memory address and a row of the encoded cells is associated with each unique match signal to produce the memory address of that unique match signal.

10. The CAM of claim 8 wherein the encoded cells are binary read only storage elements.

11. The CAM of claim 10 wherein each binary read only storage element represents either a "0" or a "1" value in a binary representation of a memory address of the CAM.

12. The CAM of claim 11 wherein the binary elements are arranged into rows where each row represents a memory address of the CAM.

13. The CAM of claim 11 wherein each encoded cell comprises a transistor for outputting that cell's represented value in response to a match signal input into that cell.

14. The CAM of claim 13 wherein each cell's transistor has an input receiving the match signal input.

15. The CAM of claim 8 further comprising a differential sense amp for sensing a change in state of the CAM encoder encoded cells.

16. The CAM of claim 15 further comprising prioritization circuitry operatively coupled between the CAM encoder and the sense amp for selectively passing one produced memory address to the sense amp when multiple memory addresses are produced by the CAM encoder.

* * * * *

UNITED STATES PATENT AND TRADEMARK OFFICE
CERTIFICATE OF CORRECTION

PATENT NO. : 6,614,675 B1
DATED : September 2, 2003
INVENTOR(S) : Price et al.

It is certified that error appears in the above-identified patent and that said Letters Patent is hereby corrected as shown below:

<u>Title page,</u>
Item [73], Assignee, delete "Barbados (KN)," and insert therefor -- Barbados (BB) --.

Signed and Sealed this

Sixth Day of April, 2004

JON W. DUDAS
*Acting Director of the United States Patent and Trademark Office*